United States Patent [19]

Merchant

[11] 3,791,885

[45] Feb. 12, 1974

[54] METHOD OF MANUFACTURING A SEMICONDUCTOR REGION

[75] Inventor: Kamal Merchant, Heilbronn, Germany

[73] Assignee: Licentia Patent-Verwaltungs-G.m.b.H., Frankfurt am Main, Germany

[22] Filed: June 28, 1971

[21] Appl. No.: 157,440

[30] Foreign Application Priority Data

July 2, 1970 Germany ........................ 2032838

[52] U.S. Cl. ................ 148/187, 148/188, 148/189, 317/235 R

[51] Int. Cl. ........................................ H01l 7/34

[58] Field of Search .................... 148/187, 188, 189

[56] References Cited

UNITED STATES PATENTS

| | | | |
|---|---|---|---|
| 3,341,381 | 9/1967 | Bergman et al. | 148/187 |
| 3,437,533 | 4/1969 | Dingwall | 148/187 |
| 3,507,716 | 4/1970 | Nishida et al. | 148/187 |
| 3,634,133 | 1/1972 | Albus | 148/187 |

*Primary Examiner*—G. T. Ozaki
*Attorney, Agent, or Firm*—Spencer & Kaye

[57] ABSTRACT

A method of manufacturing a semiconductor region comprises forming a layer of diffusion material over a diffusion window and a layer of insulating material on a semiconductor body and in which the diffusion window is formed, removing the diffusion material from the insulating layer so as to leave the diffusion material over the diffusion window and diffusing the diffusion material through the diffusion window into the semiconductor body.

9 Claims, 14 Drawing Figures

Inventor:
Kamal Merchant

BY Spencer & Kaye
ATTORNEYS.

Inventor:
Kamal Merchant

BY Spencer & Kaye
ATTORNEYS.

METHOD OF MANUFACTURING A SEMICONDUCTOR REGION

BACKGROUND OF THE INVENTION

The invention relates to a method of manufacturing a semiconductor region in a semiconductor body.

SUMMARY OF THE INVENTION

According to the invention, there is provided a method of manufacturing a semiconductor region in a semiconductor body comprising the steps of forming an insulating layer on said semiconductor body, forming a diffusion window in said insulating layer, forming a layer of diffusion material over said insulating layer and said diffusion window, diffusing said diffusion material from said diffusion material layer through said diffusion window into said semiconductor body in a first diffusion stage, removing said layer of diffusion material from said insulating layer so as to leave said diffusion material layer over said diffusion window and at most a part of said insulating layer and diffusing said diffusion material from said diffusion layer through said diffusion window into said semiconductor body in a second diffusion stage.

BRIEF DESCRIPTION OF THE DRAWINGS

The invention will now be described in greater detail, by way of example, with reference to the accompanying drawings, in which.

DESCRIPTION OF THE PREFERRED EMBODIMENT

In a preferred form of the invention, a semiconductor region is formed in a semiconductor body by means of a separation diffusion process, using a prediffusion and a post diffusion. During the prediffusion a layer of diffusion material is present both on the insulating layer which inhibits the diffusion and on the region of the semiconductor surface which is exposed by a diffusion window in the insulating layer. After the prediffusion, the diffusion material layer is removed from the surface of the insulating layer. Consequently, during the post diffusion, only the exposed semiconductor surface and at the most only a part of the insulating layer is covered with the layer of diffusion material. A prediffusion may here be defined as a diffusion in which the diffusion material is not diffused to the final depth into the semiconductor body. The final depth of the diffusion is achieved only during the post diffusion. The layer of diffusion material present on the semiconductor surface can consist, for example, of an impurity glass, e.g., phosphorus glass or boron glass and is generally formed during the prediffusion.

The invention has the advantage that it prevents undesired channels in the semiconductor body, and during the manufacture of a p-n junction by diffusion, an undesirable course of this p-n junction. The invention may be advantageously used, for example, in the emitter diffusion of diodes or transistors, although it is naturally also suitable for producing other semiconductor regions. For example, very good power transistors may be made by means of the invention.

For removing the layer of diffusion material, an etching mask is preferably used, the cross-section of which is larger than that of the diffusion window, through which the diffusion into the semiconductor element takes place. During the manufacture of the emitter region of a transistor, for example, the cross-section of the etching mask for removing the layer of diffusion material is accordingly larger than the cross-section of the emitter diffusion window, and is so large that sufficient fault positions also reach the edge of the diffused semiconductor zone. Thus, the etching mask covers the layer of diffusion material not only in the region of the emitter diffusion window, but partly also in the zone of the adjacent insulating layer. The etching mask, which is applied in the manufacturing of a transistor, for example, after the emitter-prediffusion and may consist, e.g., of a photo lacquer layer, is chosen only large enough so that it does not extend to the subsequent base contact window. However, there is also the possibility of limiting the layer of diffusion material entirely to the exposed region of the semiconductor surface, and, therefore, to remove it from the entire insulating layer. In this case, the etching mask will have the same cross-section as the diffusion window.

Figure 1:
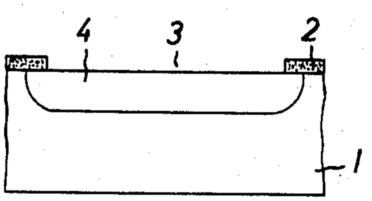
FIG. 1 is a section view of a semiconductor body at a first method stage in accordance with the invention.

Referring now to the drawings, which illustrate the steps of manufacturing a planar transistor based on a semiconductor body 1 with the conductivity type of the collector region. As shown in FIG. 1, one of the surfaces of the semiconductor body 1 receives a diffusion inhibiting insulating layer 2, consisting, for example of silicon dioxide or silicon nitride. Then, a base diffusion window 3 is formed in this insulating layer and the base region 4 is diffused into the semiconductor body 1 through this window 3.

Figure 2:
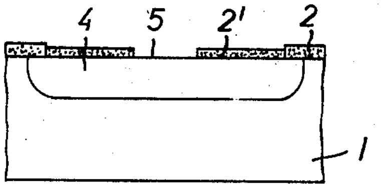
FIG. 2 is a view similar to FIG. 1 but showing a second method stage.

As shown in FIG. 2, the emitter diffusion window 5 necessary for the emitter diffusion is provided after the base diffusion in an insulating layer 2′ which is produced during or after the base diffusion in the region of the base diffusion window 3. The insulating layer 2′ may also consist, for example of silicon dioxide or silicon nitride.

Figure 3A:
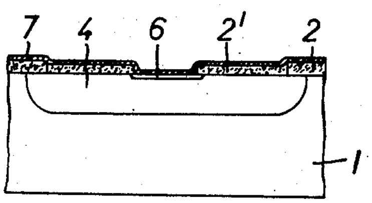
FIG. 3*a* is a view similar to FIG. 1 but showing a third method stage.
Figure 3B:
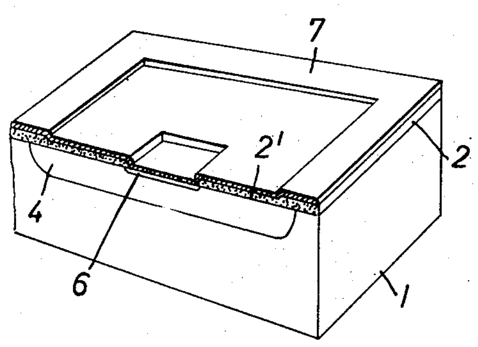
FIG. 3*b* is a perspective view partially in section of a semiconductor body showing the third method stage.

FIG. 3 shows the emitter prediffusion in which the emitter region 6 is first diffused into the semiconductor body 1 to a comparatively low depth. The actual diffusion takes place during the so-called post diffusion, so that the post diffusion may also be regarded as the main diffusion. In the embodiment of FIG. 3, during the emitter prediffusion, a layer 7 is produced on the surface, containing diffusion material and not yet present in this embodiment at the start of the prediffusion. The layer 7 of diffusion material covering the insulating layer 2 and 2′ and the exposed semiconductor surface may consist for example, of phosphorus glass if the emitter region has n-type conductivity. A layer of diffusion material on the surface may be obtained, for example, in a vapour diffusion, wherein this vapour diffusion is carried out in an oxidising atmosphere. During this period, a coherent glass layer 7, containing the appropriate diffusion material, is formed on the insulating layers 2 and 2′, and in the region of the emitter diffusion window 5. In the specific case where phosphorus is used as diffusion material, phosphorus glass is formed. After the formation of the layer of glass, the diffusion no longer occurs as a vapour diffusion, but from the glass layer. The layer 7 of diffusion material already may be present at the start of the prediffusion, so that a diffusion out of a layer of diffusion material takes place from the start.

Figure 4A:
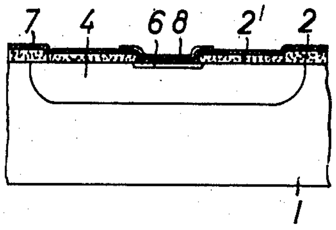
FIG. 4*a* is a view similar to FIG. 1 but showing a fourth method stage.
Figure 4B:
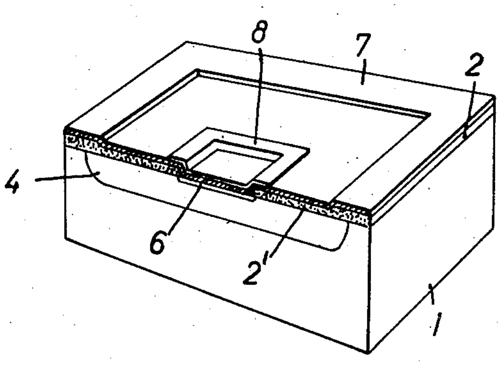
FIG. 4*b* is a view similar to FIG. 3*b* but showing the fourth method stage.

According to the invention, the layer 7 containing the diffusion material is not left on the insulating layers and its major part is removed. To this end, according to FIG. 4, an etching mask 8 is applied to the layer 7 of diffusion material, covering the diffusion material layer not only in the region of the emitter diffusion window, but also slightly extending beyond the same. The cross-section of the etching mask 8, consisting, for example, of a layer of photo-sensitive lacquer or varnish, is therefore larger than the cross-section of the emitter diffusion window, and is so large that sufficient faults (diffusion material) also reach the edge of the emitter region during the post diffusion process.

Figure 5A:
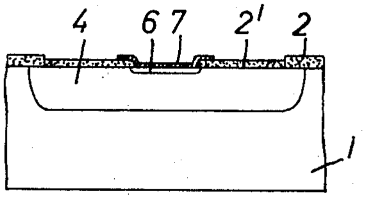
FIG. 5*a* is a view similar to FIG. 1, but showing a fifth method stage.
Figure 5B:
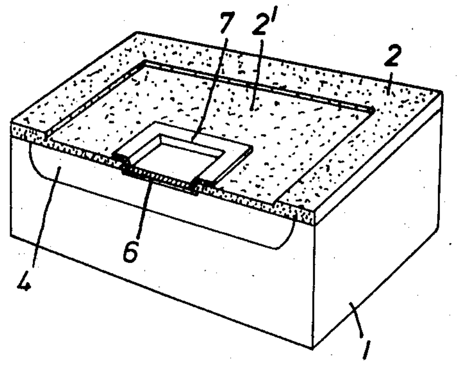
FIG. 5*b* is a view similar to FIG. 3*b* but showing the fifth method stage.
Figure 6A:
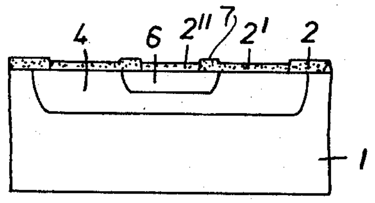
FIG. 6*a* is a view similar to FIG. 1 but showing a sixth method stage.

In the arrangement of FIG. 5, the layer 7 of diffusion material has already been largely etched away in such a manner that it only covers the semiconductor surface in the region of the emitter diffusion window and a part of the adjacent insulating layer 2′. After this partial removal of the diffusion material layer 7, the actual emitter diffusion takes place, in accordance with FIG. 6, in the form of a post diffusion, during which the emitter region 6 is diffused into the semiconductor body 1 to a sufficient depth. During the diffusion of the emitter, an insulating layer 2″ is formed over the region 6.

Figure 7B:
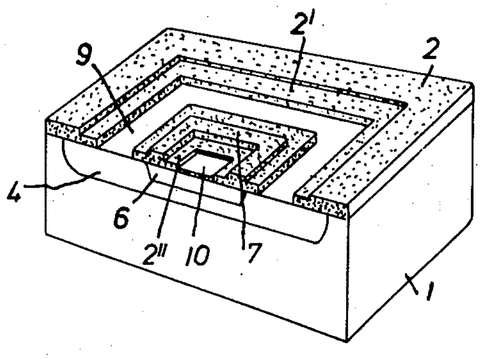
FIG. 7*b* is a view similar to FIG. 3*b* but showing the seventh method stage.
Figure 8A:
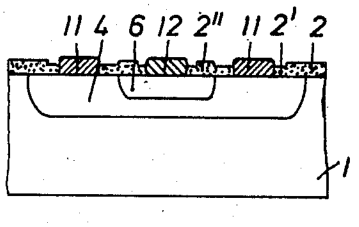
FIG. 8*a* is a sectional view of a complete transistor.
Figures 6B, 7A:
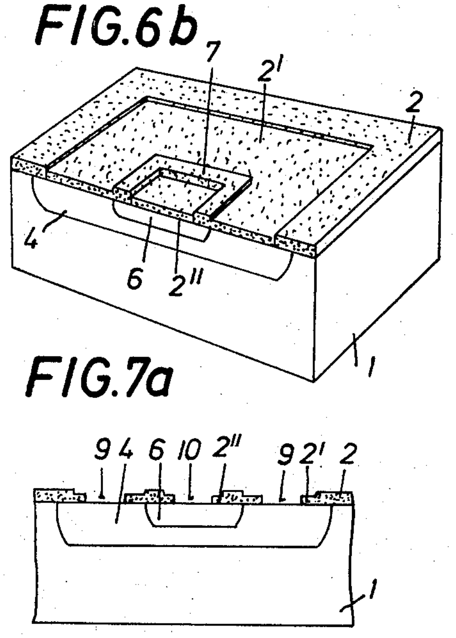
FIG. 6*b* is a view similar to FIG. 3*b* but showing the sixth stage.
FIG. 7*a* is a view similar to FIG. 1 but showing a seventh method stage.
Figure 8B:
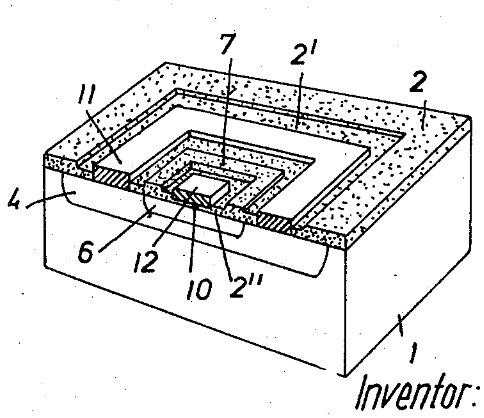
FIG. 8*b* is a perspective and part section view of the completed transistor of FIG. 8*a*.

According to FIG. 7, for contacting the base zone, a base contact making window 9 is formed in the insulating layer 2′ and for contacting the emitter region, an emitter contacting making window 10 is formed in the insulating layer 2″. By inserting contact material into these two openings the base electrode 11 and the emitter electrode 12 are finally formed as shown in FIG. 8.

It will be understood that the above description of the present invention is susceptible to various modifications, changes and adaptations.

What is claimed is:

1. A method of manufacturing a semiconductor region in a semiconductor body comprising the steps of forming a diffusion inhibiting insulating layer on said semiconductor body, forming a diffusion window in said insulating layer, forming a layer of diffusion material over said insulating layer and said diffusion window, diffusing said diffusion material from said diffusion material layer through said diffusion window into said semiconductor body to a first diffusion depth in a first diffusion stage, removing said layer of diffusion material from at least a major portion of said insulating layer so as to leave said diffusion material layer over said diffusion window and the portion of said insulating layer around and adjacent said diffusion window, and diffusing said diffusion material from said diffusion layer through said diffusion window into said semiconductor body to a final diffusion depth in a second diffusion stage.

2. A method as defined in claim 1, wherein said diffusion material layer is removed by etching using an etching mask having an area larger than the area of said diffusion window.

3. A method as defined in claim 1, wherein said first diffusion stage occurs simultaneously with the formation of said diffusion material layer.

4. A method as defined in claim 1, wherein said diffusion material layer is a glass layer formed by vapour diffusion in an oxidising atmosphere.

5. A method as defined in claim 1, wherein said semiconductor body includes a base region and wherein an emitter region of a transistor is formed by said diffusion through said diffusion window into the base region.

6. A method as defined in claim 5, wherein said diffusion material layer is removed by etching using an etching mask whose area is larger than that of said diffusion window so as to cover not only said diffusion window but also a portion of said insulating layer adjacent said diffusion window.

7. A method as defined in claim 6 wherein a major portion of the surface area of said insulating layer is free of the etching mask so that this area is free of said diffusion material layer subsequent to the etching, and further comprising the step of forming a further window in said area of said insulating layer which is free of said diffusion material layer for providing a contact area for the base region of the transistor.

8. A method as defined in claim 7, wherein said etching mask is a layer of photo-sensitive lacquer.

9. A method as defined in claim 8, wherein said diffusion window for said emitter region is used for a phosphorus diffusion.

* * * * *